United States Patent [19]

Brownell et al.

[11] Patent Number: 4,642,162
[45] Date of Patent: Feb. 10, 1987

[54] PLANARIZATION OF DIELECTRIC LAYERS IN INTEGRATED CIRCUITS

[75] Inventors: David J. Brownell, Maple Grove; Daniel C. Christensen, Plymouth; David G. Erie, Cottage Grove; Daniel Youngner, Maple Grove, all of Minn.

[73] Assignee: Honeywell Inc., Minneapolis, Minn.

[21] Appl. No.: 815,603

[22] Filed: Jan. 2, 1986

[51] Int. Cl.$^4$ .................. B44C 1/22; C03B 15/00
[52] U.S. Cl. .................. 156/643; 156/634; 156/650; 156/653; 156/661.1; 430/314; 430/316; 430/317; 430/318
[58] Field of Search .............. 156/643, 656, 634, 652, 156/650, 633, 667, 653, 661.1; 430/314, 316-318

[56] References Cited

U.S. PATENT DOCUMENTS

| | | | |
|---|---|---|---|
| 4,233,091 | 11/1980 | Kawabe | 156/653 X |
| 4,437,227 | 3/1984 | Flannery et al. | 156/643 X |
| 4,451,326 | 5/1984 | Gwozdz | 156/643 |
| 4,455,194 | 6/1984 | Yabu et al. | 156/653 |
| 4,481,070 | 11/1984 | Thomas et al. | 156/643 |
| 4,511,430 | 5/1985 | Chen et al. | 156/643 |
| 4,541,169 | 9/1985 | Bartush | 156/650 X |
| 4,560,435 | 12/1985 | Brown et al. | 156/661.1 X |
| 4,599,137 | 7/1986 | Akiya | 156/643 |

OTHER PUBLICATIONS

Adams, A. C., "Plasma Planarization", Solid State Technology, Apr. 1981, pp. 178-181.
Ting, C. Y., "Study of Planarized Sputter-deposited SiO$_2$", J. Vac Sci. Technol., 15(3) May/Jun. 1978, pp. 1105-1112.

Primary Examiner—Robert Lindsay
Attorney, Agent, or Firm—William T. Udseth

[57] ABSTRACT

A method is disclosed for the planarization of a semiconductor device structure by a two stage planarization process which comprises: applying a dielectric layer over a first conductive layer, spin coating an organic layer onto the first dielectric layer, etching the device in a plasma etching process to substantially remove the organic planarization layer, then etching the device in a plasma etching process which etches the exposed dielectric layer to substantially remove all of it, removing the remaining organic planarization layer, followed by the application of a second dielectric layer under bias sputter deposition conditions. The bias sputter deposition fills trenches and eliminates peaks in the remaining first dielectric layer as it builds up the second dielectric layer. The process planarizes the dielectric layer without thickness variations dependent upon conductor layer pattern density.

24 Claims, 10 Drawing Figures

PLANARIZATION OF DIELECTRIC LAYERS IN INTEGRATED CIRCUITS

DESCRIPTION

Background of the Invention

This invention relates to a method for making semiconductor device structures having a plurality of conductive layers. More particularily, this invention relates to a planarization method for producing a smooth dielectric layer having a uniform thickness between conductive layers in an integrated circuit.

In the production of integrated circuit structures, it has become increasingly important to provide structures having a plurality of conductive layers due to the ever increasing density of the circuit elements in a structure. To provide metallization layers without discontinuities or significant reductions in cross-sectional area, it is desirous to provide an underlying surface for the metallization layer which is as flat or planar as possible. Traditionally this has been accomplished using doped glass which is subsequently heated to its softening point to provide smoother step coverage and a more planar surface beneath subsequent metallization layers. However, the application of heat to an integrated circuit structure in an amount sufficient to soften the doped glass is enough to change the electrical characteristics of the integrated circuit and is therefore undesirable. Additionally, the softening point temperature of doped glasses is above the melting point of aluminum and precludes the use of aluminum prior to doped glass reflow.

It has, therefore, become the practice to smooth the surface of a dielectric layer in preparation for a subsequently applied metallization layer by a process of planarization. An insulation material, such as an oxide, is applied over the first metallization layer followed by application of another etchable material which can be easily removed after the etching such as a layer of photoresist. The insulating dielectric material and the photoresist are then subjected to a plasma etching process where the photoresist and the dielectric etch at approximately the same rate. The plasma etch removes a portion of the photoresist as well as the raised portions of the underlying dielectric material. The smooth topography at the top of the photoresist is transferred into the dielectric layer. This process is described in a paper by A. C. Adams, *Solid State Technology April* 1981 entitled "Plasma Planarization".

The technique described above does not provide a uniform thickness of a dielectric layer over the conductive layer. Because the organic or photoresist layer used by Adams does not have the uniform thickness across the wafer, the organic layer tends to be thicker over metal pads and areas of high metal density, and thinner over isolated metal lines and areas of low metal density. Therefore, after etch-back of the planarization and dielectric layers, the dielectric is thicker over metal pads and dense metal areas and thinner over isolated metal lines. VLSI integrated circuits require small area via openings and precise feature control of these openings to minimize the area needed for intermetal connections. The variation in dielectric thickness remaining after this planarization technique is not suitable for newer integrated circuit technologies. The dielectric thickness variations cause difficulty in photolithography of vias due to different light reflections for various dielectric thicknesses and in etching due to overetching of the thinner dielectric regions while waiting for thicker dielectric regions to completely etch.

SUMMARY OF THE INVENTION

The present invention is a process for providing a planarized constant thickness dielectric layer between multiple conductive layers in an integrated circuit structure.

The method comprises defining a first conductive layer having a preselected interconnect pattern on the semiconductor device. A first dielectric layer is applied over the first interconnect layer in a conventional manner. The first dielectric layer, however, will have an irregular profile corresponding to the topography of the first conductive layer. In order to smooth the surface of the dielectric layer, a planarization layer is next applied. The planarization layer selected should have a low viscosity and should flow at relatively low temperatures to form a smooth profile. Next, the semiconductor device is plasma etched to remove a substantial portion of the planarization layer leaving exposed portions of the dielectric layer. Then, the semiconductor device is etched in a plasma etching process which etches the dielectric layer faster than the organic layer to substantially remove the dielectric over the underlying conductor layer. The remaining planarization layer is then removed. The final step is to apply a second dielectric layer under bias sputter deposition conditions. The bias sputter deposition conditions will fill the valleys and level the peaks in the remaining first dielectric layer. The result is a planarized dielectric layer having a uniform thickness over the underlying conductive layer. The process can be repeated for as many levels of conductors as are used in the integrated circuit.

Use of the present invention allows variation in the planarization layer to be transferred to variations in the first dielectric layer. The variations in the first dielectric take the form of peaks and valleys. These peaks and valleys are sufficiently narrow so as to be completely planarized during the deposition of a second dielectric layer by bias sputter deposition techniques.

DESCRIPTION OF THE PREFERRED EMBODIMENT

The invention provides a process for achieving planarization of dielectric layers placed over conductive layers in a semiconductor device, the dielectric layers having a smooth yet uniform thickness over the underlying conductive layer.

Figure 1A:
FIGS. 1a, 1b, 1c are vertical cross sections of a portion of a prior art semiconductor device illustrating plasma planarization.
Figure 1B:
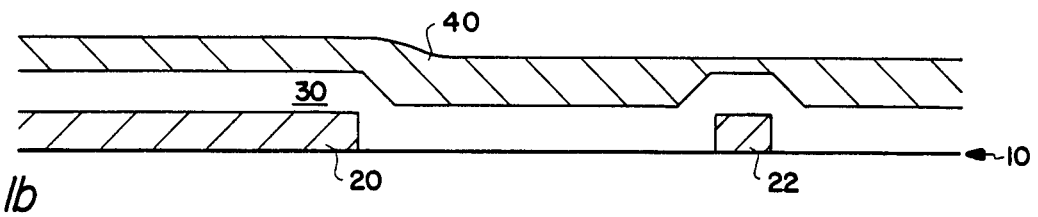
Figure 1C:
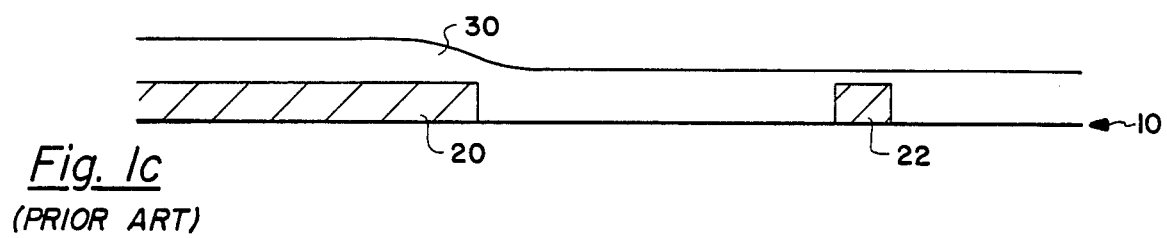

Referring to FIGS. 1a, 1b, and 1c the problems of the prior art are illustrated. Shown is a partially complete semiconductor device having a surface 10. Upon the device surface 10 a metallization layer has been patterned to provide a metal pad 20 and a metal line 22. An insulating dielectric layer 30 has been applied over the patterned metal layer. The dielectric layer 30 has an irregular profile corresponding to the metal layer. The rough topology of the dielectric layer 30 makes it difficult to deposit and pattern subsequent layers of metal. To smooth the dielectric layer 30 a planarization layer 40 having a smooth profile relative to that of the first dielectric is applied as shown in FIG. 1b. This planarization layer can be an organic material, such as photoresist, applied by spin coating. This planarization layer 40 is etched using a plasma etching process having etch rates for the photoresist layer 40 and the dielectric layer 30 nearly equal. After plasma etching a substantial portion of the planarization layer 40 and a portion of the dielectric layer 30, the remaining planarization layer 40 is removed. The dielectric layer has a profile as shown in FIG. 1c, where the dielectric layer 30 now has a smoother surface than before with rounded corners and a smooth contour integrating out irregularities in the dielectric layer caused by the underlying metal layer pattern As can be seen in FIG. 1c the thickness of the dielectric layer 30 is greater over the metal pad region 20 than over the metal runner 22. The cross-sectional shape of the dielectric layer 30 corresponds to the shape of the organic planarization layer 40. Via interconnections between conductive layers must be made through a varying thickness of dielectric. Via or contact connections to metal runners 22 will be significantly overetched while waiting for the via or contact openings over metal pad 20 to be cleared. Dielectric thickness variations over the underlying conductor layer make feature size control very difficult.

Figure 2:
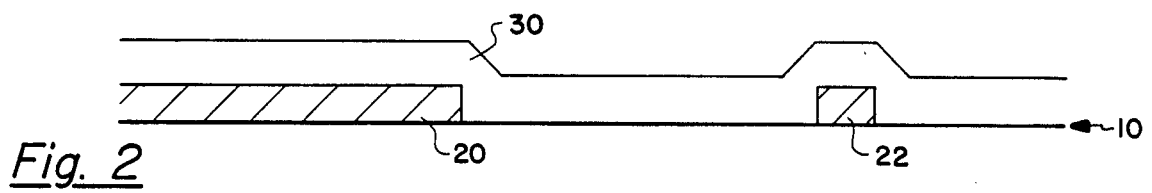
FIGS. 2–6 are cross-sectional views of a portion of a semiconductor device undergoing the processing steps of the present invention prior to deposition of the second dielectric layer.
Figure 3:
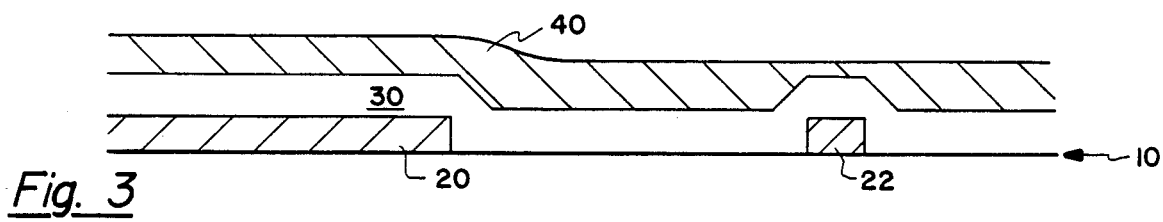

Turning now to FIG. 2, the process of the present invention will be described and illustrated in a step by step fashion. In FIG. 2 the semiconductor device structure having a surface 10 is illustrated having a first metal layer which has been patterned into pad region 20 and metal line 22. On top of the semiconductor device has been coated an insulating dielectric layer 30 covering both the underlying metal regions 20 and 22 and the semiconductor device surface 10. The dielectric layer 30 has an irregular profile corresponding to the first conductor layer.

The insulating dielectric material used may be an oxide such as silicon oxide. However, it should be noted that other dielectric materials such as silicon nitride, alumina or silicon oxide doped with phosphorous may be used instead of silicon oxide. The first dielectric layer may be formed by CVD, evaporization, sputtering, or other deposition or growth technique.

To planarize the first dielectric layer 30 a sacrificial planarization layer 40 having a relatively smooth surface with small gentle steps is applied to the semiconductor device. The planarization layer 40 is most easily achieved using an organic material having a low viscosity which flows during application or during a low temperature bake. Typical organic layers used are positive photoresist or polyimide available from various manufacturers. If photoresist is used it can be spin coated similar to a conventional photolithography step in integrated circuit manufacturing. The photoresist will be thicker in the field or valley regions of the semiconductor device and thinner on the raised portions of the device. An example of an inorganic planarization layer is spun glasses, such as emulsified doped silicon dioxide.

Figure 4:
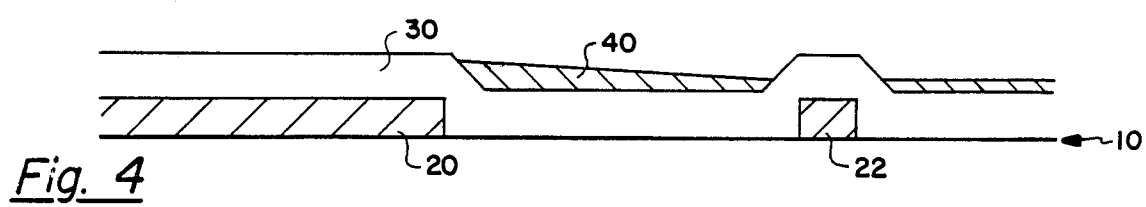

Next, the semiconductor device is etched in a plasma etching process with arbitrary selectivity between the organic planarization layer and the dielectric layer to remove a substantial portion of the planarization layer 40 to expose raised portions of the first dielectric layer 30. Though the selectivity between the organic planarization layer and the dielectric layer 30 is arbitrary, it is preferred that the organic layer be etched faster than the dielectric layer to prevent overhanging ledges of dielectric material. The result of this etching is shown in FIG. 4.

Figure 5:
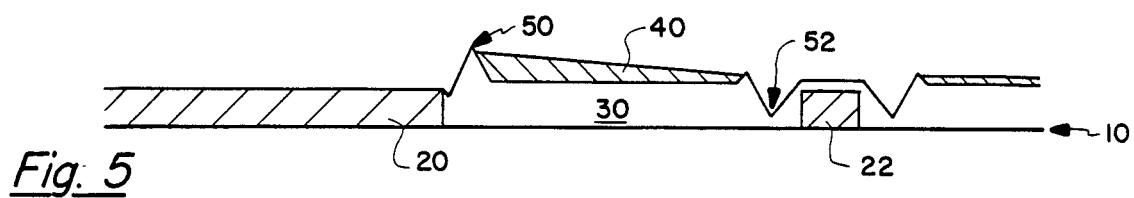
Figure 6:
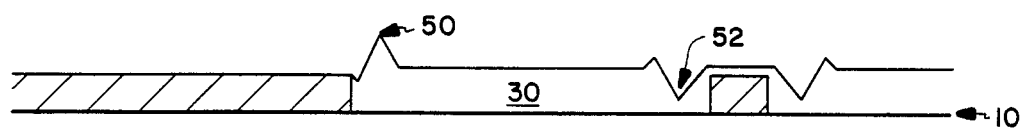

As shown in FIG. 5, the semiconductor device is then plasma etched in a process which etches the dielectric layer 30 faster than the organic planarization layer 40 to remove substantially all of the exposed dielectric layer. This leaves peaks or ridges 50 and valleys or trenches 52 in the dielectric layer. Next, as shown in FIG. 6, the organic planarization layer 40 is completely removed. This can be done by plasma etching or solvent stripping.

Figure 7A:
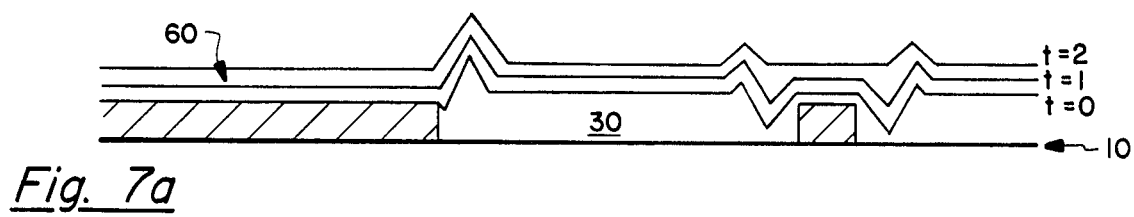
FIGS. 7a and 7b are cross-sectional views of a semiconductor device showing the bias sputter deposition of a second dielectric layer.
Figure 7B:
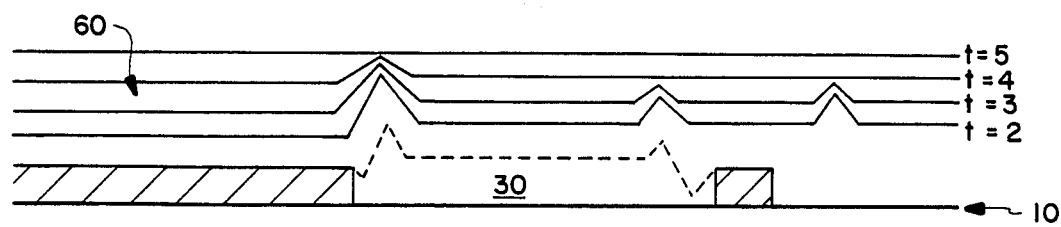

A second insulating dielectric layer 60 is now needed to cover the exposed first metal layer. By employing known bias sputtering techniques as discussed in "Study of Planarized Sputter-Deposited SiO$_2$", *Journal of Vacuum Science and Technology*, May-June 1978 by C. Y. Ting, V. J. Vivalda, and H. G. Schaefer, the peaks and valleys 50 and 52 that remain in the first dielectric layer 30 can be eliminated. To deposit the second dielectric layer 60 in a planar fashion it is best to start the sputter deposition with a low voltage bias which tends to planarize the valleys as shown in FIG. 7a. The low bias sputtering induces a near conformal deposition coating and fills the valleys. At time t=2 the valleys have been totally eliminated. This can be followed by high voltage bias sputtering to planarize the peaks as shown in 7b. The high bias sputtering erodes the peaks, lowering the steps as it fills the field regions. At time t=5 a completely planarized semiconductor device is shown having a uniform dielectric thickness over both high density metal areas and metal runners.

The present invention can be used at any step in the manufacture of semiconductor devices such as after the gate level whether it is metal, polysilicon, or a refractory metal silicide, for double polysilicon interconnects, or for multiple metallization levels as long as the second dielectric layer can be sputter deposited.

The embodiments of the invention in which an exclusive property or right is claimed are defined as follows:

1. A method for the planarization of a semiconductor device comprising:
    (a) defining on the device a first conductive layer having a preselected interconnect pattern;
    (b) applying a first dielectric layer over the first conductive layer, the first layer having an irregular profile corresponding to the first conductive layer;
    (c) applying a planarization layer over the first dielectric layer, the planarization layer having a smooth profile relative to that of the first dielectric layer;
    (d) etching the planarization layer to substantially remove the planarization layer and expose raised portions of the first dielectric layer, some portion of the planarization layer remaining;
    (e) etching the first dielectric layer to subtantially remove the first dielectric layer over the first conductive layer;
    (f) removing the remaining planarization layer; and
    (g) applying a second dielectric layer by bias sputter deposition.

2. The method of claim 1 wherein the planarization layer is an organic material.

3. The method of claim 2 wherein the planarization layer is photoresist.

4. The method of claim 1 wherein the first dielectric layer is silicon dioxide or phosphoroussilicon dioxide.

5. The method of claim 1 wherein the conductive layer is aluminum, aluminum-copper, aluminum-silicon, or aluminum-copper-silicon.

6. The method of claim 1 wherein the conductive layer is tungsten, polysilicon, or a refractory metal silicide.

7. The method of claim 1 wherein the planarization layer is plasma etched in step (d).

8. The method of claim 1 wherein the dielectric layer is plasma etched in step (e).

9. The method of claim 7 wherein the plasma etching is anisotropic reactive ion etching.

10. The method of claim 8 wherein the plasma etching is anisotropic reactive ion etching.

11. The method of claim 1 wherein the second dielectric layer is deposited first by low voltage bias sputter deposition followed by high voltage bias sputter deposition.

12. The method of claim 11 wherein the second dielectric layer is silicon dioxide.

13. A method for the planarization of dielectric layers in an integrated circuit comprising:
  (a) defining on the circuit a first conductive layer having a preselected interconnect pattern;
  (b) applying a first dielectric layer over the first conductive layer, the first dielectric layer having an irregular profile corresponding to the first conductive layer;
  (c) applying a planarization layer over the first dielectric layer, the planarization layer having a smooth profile relative to that of the first dielectric layer;
  (d) etching the planarization layer to substantially remove the planarization layer and expose raised portions of the first dielectric layer, some portion of the planarization layer remaining;
  (e) etching the first dielectric layer to substantially remove the first dielectric layer over the first conductive layer;
  (f) removing the remaining planarization layer; and
  (g) applying a second dielectric layer by bias sputter deposition.

14. The method of claim 13 wherein the planarization layer is an organic material.

15. The method of claim 14 wherein the planarization layer is photoresist.

16. The method of claim 13 wherein the first dielectric is silicon dioxide or phosphorous-silicon dioxide.

17. The method of claim 13 wherein the conductive layer is aluminum, aluminum-copper, aluminum-silicon, or aluminum-copper-silicon.

18. The method of claim 13 wherein the conductive layer is tungsten, polysilicon, or a refractory metal silicide.

19. The method of claim 13 wherein the planarization layer is plasma etched in step (d).

20. The method of claim 13 wherein the dielectric layer is plasma etched in step (e).

21. The method of claim 19 wherein the plasma etching is anisotropic reactive ion etching.

22. The method of claim 20 wherein the plasma etching is anisotropic reactive ion etching.

23. The method of claim 13 wherein the second dielectric layer is deposited first by low voltage bias sputter deposition followed by high voltage bias sputter deposition.

24. The method of claim 13 wherein the second dielectric layer is silicon dioxide.

* * * * *